US010072328B2

(12) United States Patent
Ghosh et al.

(10) Patent No.: US 10,072,328 B2
(45) Date of Patent: Sep. 11, 2018

(54) HIGH-PRECISION SHADOW-MASK-DEPOSITION SYSTEM AND METHOD THEREFOR

(71) Applicant: eMagin Corporation, Hopewell Junction, NY (US)

(72) Inventors: Amalkumar P. Ghosh, Hopewell Junction, NY (US); Fridrich Vazan, Pittsford, NY (US); Munisamy Anandan, Austin, TX (US); Evan Donoghue, Hopewell Junction, NY (US); Ilyas I. Khayrullin, Hopewell Junction, NY (US); Tariq Ali, Hopewell Junction, NY (US); Kerry Tice, Hopewell Junction, NY (US)

(73) Assignee: eMagin Corporation, Hopewell Junction, NY (US)

( * ) Notice: Subject to any disclaimer, the term of this patent is extended or adjusted under 35 U.S.C. 154(b) by 0 days.

(21) Appl. No.: 15/597,635

(22) Filed: May 17, 2017

(65) Prior Publication Data
US 2017/0342542 A1 Nov. 30, 2017

Related U.S. Application Data

(60) Provisional application No. 62/340,793, filed on May 24, 2016.

(51) Int. Cl.
*H01L 51/00* (2006.01)
*C23C 14/04* (2006.01)
(Continued)

(52) U.S. Cl.
CPC ............ *C23C 14/042* (2013.01); *C23C 14/24* (2013.01); *H01L 51/001* (2013.01); *H01L 51/0011* (2013.01); *H01L 51/56* (2013.01)

(58) Field of Classification Search
CPC ... H01L 51/001; H01L 51/0011; H01L 51/56; H01L 51/0008; H01L 51/50; C23C 14/042; C23C 14/24; C23C 14/12; C23C 14/225
See application file for complete search history.

(56) References Cited

U.S. PATENT DOCUMENTS

| 4,393,131 A | 7/1983 | Whalin et al. |
| 4,902,377 A | 2/1990 | Berglund et al. |

(Continued)

FOREIGN PATENT DOCUMENTS

| CN | 1461234 A | 12/2003 |
| CN | 1522098 A | 8/2004 |

(Continued)

OTHER PUBLICATIONS

Hyung-Joon Shin et al, "Patterning of ferroelectric nanodot arrays using a silicon nitride shadow mask"; http://adsabs.harvard.edu/abs/2005ApPhL..87k3114S, "Applied Physics Letters", Sep. 2005, vol. 87, No. Issue 11, id. 113114, Publisher: American Institute of Physics, Published in: KR.

(Continued)

*Primary Examiner* — Nikolay Yushin
(74) *Attorney, Agent, or Firm* — Kaplan Breyer Schwarz, LLP

(57) ABSTRACT

A direct-deposition system capable of forming a high-resolution pattern of material on a substrate is disclosed. Vaporized atoms from an evaporation source pass through an aperture pattern of a shadow mask to deposit on the substrate in the desired pattern. Prior to reaching the shadow mask, the vaporized atoms pass through a collimator that operates as a spatial filter that blocks any atoms not travelling along directions that are nearly normal to the substrate surface. As a result, the vaporized atoms that pass through the shadow mask exhibit little or no lateral spread (i.e., (Continued)

feathering) after passing through its apertures and the material deposits on the substrate in a pattern that has very high fidelity with the aperture pattern of the shadow mask. The present invention, therefore, mitigates the need for relatively large space between regions of deposited material normally required in the prior art, thereby enabling high-resolution patterning.

32 Claims, 5 Drawing Sheets

(51) Int. Cl.
*C23C 14/24* (2006.01)
*H01L 51/56* (2006.01)

(56) References Cited

U.S. PATENT DOCUMENTS

| | | | |
|---|---|---|---|
| 6,287,436 B1 | 9/2001 | Pelletier et al. | |
| 7,282,240 B1 | 10/2007 | Jackman et al. | |
| 7,615,161 B2 | 11/2009 | Hoffman | |
| 7,977,868 B2 | 7/2011 | Shieh et al. | |
| 8,673,077 B2 * | 3/2014 | Sonoda | C23C 14/042 |
| | | | 118/716 |
| 8,742,658 B2 | 6/2014 | Yu et al. | |
| 8,879,766 B1 | 11/2014 | Zhang | |
| 8,940,568 B2 | 1/2015 | Mohan et al. | |
| 9,142,779 B2 | 9/2015 | Chan et al. | |
| 2002/0180331 A1 | 12/2002 | Fukumoto | |
| 2004/0142108 A1 | 7/2004 | Atobe et al. | |
| 2004/0219465 A1 | 11/2004 | Meijer et al. | |
| 2005/0212419 A1 | 9/2005 | Vazan et al. | |
| 2007/0099395 A1 | 5/2007 | Sridhar et al. | |
| 2007/0246705 A1 | 10/2007 | Li et al. | |
| 2009/0091238 A1 | 4/2009 | Cok et al. | |
| 2010/0297349 A1 * | 11/2010 | Lee | C23C 14/24 |
| | | | 427/248.1 |
| 2013/0168231 A1 | 7/2013 | Yang et al. | |
| 2013/0320837 A1 | 12/2013 | Weaver et al. | |
| 2013/0344612 A1 | 12/2013 | Zuo | |
| 2014/0342102 A1 | 11/2014 | Ambrose et al. | |
| 2015/0275351 A1 | 10/2015 | Lee et al. | |
| 2015/0380652 A1 | 12/2015 | Chan et al. | |
| 2016/0141498 A1 | 5/2016 | Ghosh et al. | |
| 2017/0342542 A1 | 11/2017 | Ghosh et al. | |
| 2017/0342543 A1 | 11/2017 | Ghosh et al. | |
| 2017/0343901 A1 | 11/2017 | Ghosh et al. | |

FOREIGN PATENT DOCUMENTS

| | | |
|---|---|---|
| CN | 102482759 A | 5/2012 |
| CN | 103282543 A | 9/2013 |
| EP | 2168644 A1 | 3/2010 |
| RU | 2032765 C1 | 4/1995 |
| RU | 2155204 C2 | 8/2000 |
| RU | 2538891 C2 | 1/2015 |
| RU | 2014138799 A | 4/2016 |
| RU | 2588921 C2 | 7/2016 |
| TW | 201100577 A | 1/2011 |
| WO | 2000008228 A1 | 2/2000 |
| WO | 2002024321 A1 | 3/2002 |
| WO | 2010113102 A1 | 10/2010 |

OTHER PUBLICATIONS

Luis Guillermo Villaneuva et al, "Resistless Fabrication of Nanoimprint Lithography (NIL) Stamps Using Nano-Stencil Lithography"; http://www.mdpi.com/2072-666X/4/4/370/htm, "Micromachines", Oct. 15, 2013, vol. 4(4), 370-377, Publisher: MDPI; doi :10.3390/mi4040370, Published in: CH.

"Office Action" issued in related co-pending U.S. Appl. No. 14/941,825, dated Apr. 20, 2017.

Fu-Ching Tung et al., "OLED Fabrication by Using a Novel Planar Evaporation Technique", http://dx/doi.org/10.1155/2014/683037, "International Journal of Photoenergy", Publisher: Hindawi Publishing Corporation, dated Jun. 22, 2014, vol. 2014, Article ID 683037, 8 pages, Published in: TW.

"Final Office Action", U.S. Appl. No. 14/941,825, dated Nov. 14, 2017, 11 pp.

Officer E. Eskina, "International Search Report and the Written Opinion", International Patent Application PCT/US2017/033161, Completed Aug. 11, 2017, 9 pp.

Officer A. Pimenova, "International Search Report and the Written Opinion", International Patent Application PCT/US2017/034203, Completed Aug. 15, 2017, 8 pp.

Officer A. Pimenova, "International Search Report and the Written Opinion", International Patent Application PCT/IB2017/054481, Completed Oct. 25, 2017, 11 pp.

"Taiwan Office Action", Taiwan Patent Application 106117271, dated Jan. 18, 2018, 11 pp.

"Non Final Office Action" dated Feb. 23, 2018 in related U.S. Appl. No. 15/602,939.

Office Action issued in related Taiwan Application No. 106117271, dated Jan. 17, 2018, pp. 18.

* cited by examiner

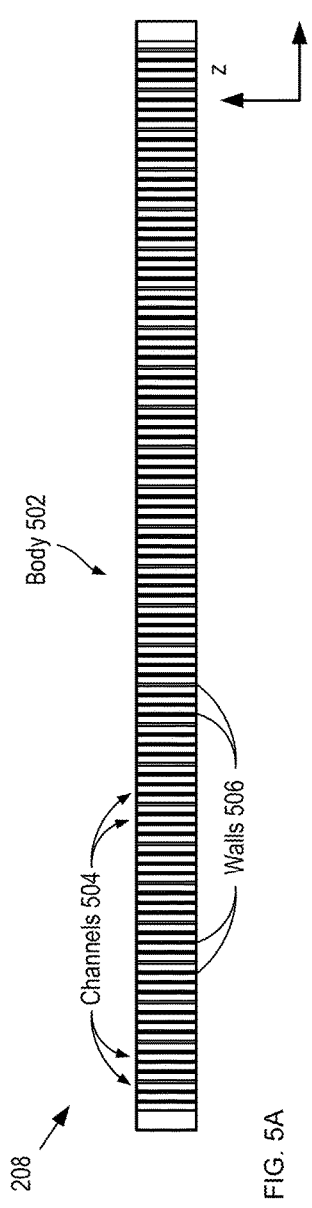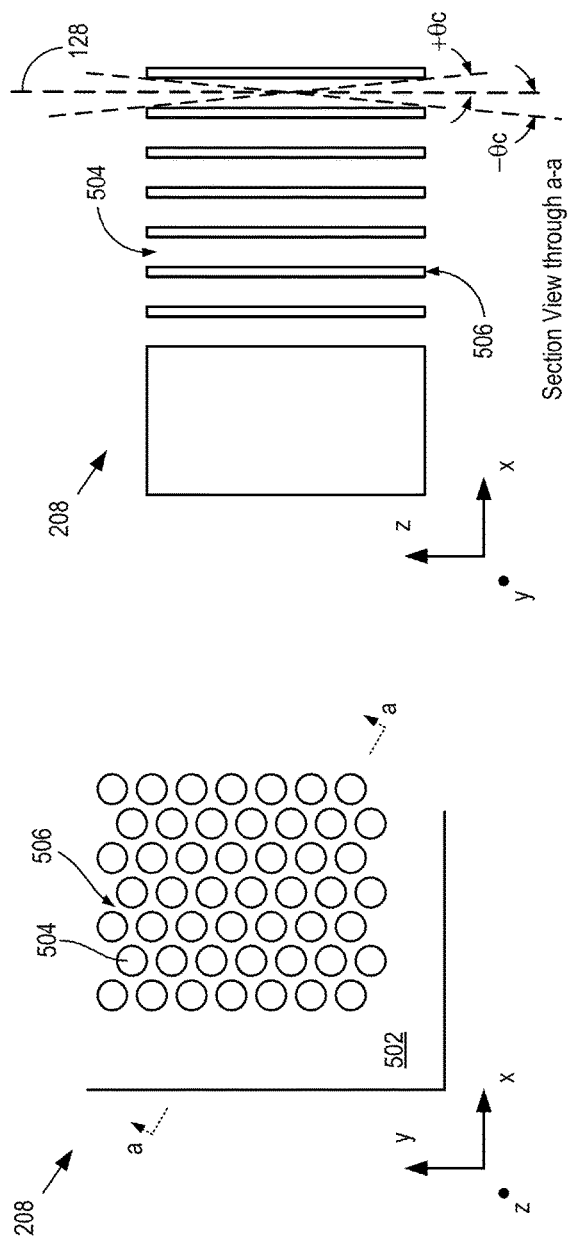

HIGH-PRECISION SHADOW-MASK-DEPOSITION SYSTEM AND METHOD THEREFOR

STATEMENT OF RELATED CASES

This case claims priority to U.S. Provisional Patent Application Ser. No. 62/340,793 filed on May 24, 2016, which is incorporated herein by reference.

FIELD OF THE INVENTION

The present invention relates to thin-film deposition in general, and, more particularly, evaporation-based thin-film deposition.

BACKGROUND OF THE INVENTION

Shadow-mask-based deposition is a process by which a material is deposited onto the surface of a substrate such that the deposited material is patterned as desired during the deposition process itself. This is often referred to as "directly patterned" the patterned layer of material.

In a typical shadow-mask deposition process, the desired material is vaporized at a source that is located some distance from the substrate. As the vaporized atoms of the material travel toward the substrate, they must pass through a shadow mask that is positioned just in front of the substrate surface. The shadow mask contains openings (i.e., apertures) whose arrangement matches that of the desired pattern for the material on the substrate (in similar fashion to a silk screen or art stencil). As a result, the vaporized atoms pass only through the apertures to deposit on the substrate surface.

Shadow-mask-based deposition has been used in the integrated-circuit (IC) industry to deposit patterns of material on substrates for many years, due, in part, to the fact that it avoids the need for patterning a material layer after it has been deposited. As a result, its use eliminates the need to expose the deposited material to harsh chemicals, such as acid-based etchants, caustic photolithography development chemicals, and the like, to pattern it. In addition, its use also reduces the amount of handling and additional processing to which the substrate must be subjected, thereby potentially reducing substrate breakage and increasing fabrication yield. For many materials, such as organic materials, patterning by shadow mask is virtually a necessity because the materials cannot be subjected to photolithographic chemicals.

Unfortunately, the feature resolution that can be obtained by shadow-mask deposition is diminished due to the fact that the deposited material tends to spread laterally after passing through the shadow mask—referred to as "feathering." As a result, critical features must be separated by relatively large areas of open space between them. In many applications, this has limited the density of overall device resolution that can be obtained.

For example, active-matrix organic light-emitting-diode (AMOLED) displays require shadow-mask-based deposition of their light-emitting material because these materials cannot be subjected to photolithography or etching. For full-color AMOLED displays, each display pixel includes several regions—referred to as "sub-pixels" of light-emitting material, each emitting a different color. Due to feathering issues, however, relatively large safety-margin gaps must be included between these subpixel regions to ensure no overlap in deposited materials. In some cases, these gaps must be nearly as large as the subpixel itself which introduces undesired optical artifacts—particularly when viewed in near-to-eye applications, such as head mounted displays. Prior-art AMOLED displays, therefore, have typically been restricted to approximately 600 pixels-per-inch (ppi) or less which is insufficient for many applications, including near-to-eye augmented reality and virtual reality applications. In addition, the need for large gaps between subpixels gives rise to reduced pixel fill factor, which reduces display brightness. As a result, the current density through the organic layers must be increased to provide the desired brightness, which can decrease display lifetime.

An alternative approach is to use a shadow-mask with an aperture as large as the active area of the display itself to deposit a monochrome white-emitting organic layer across the entire display and then to pattern or deposit red, green and blue color filters on top of the OLED. These color filters absorb all of the emitted white light except for the red, green or blue portion of the spectrum (depending on the color filter), allowing a full color image to be created. However, these color filters absorb up to 80% of the emitted light which significantly reduces display brightness, again requiring operation at higher than desirable drive currents.

The need for a process that is suitable for directly patterning high-resolution patterns of material on a substrate remains unmet in the prior art.

SUMMARY OF THE INVENTION

The present invention enables high-resolution direct deposition of a patterned layer of material on a substrate. Embodiments of the present invention filter the propagation angles of vaporized atoms to a narrow range around a direction normal to the surface of the substrate. As a result, feathering of deposited material outside the lateral dimensions of features of a shadow mask is mitigated. Embodiments of the present invention are particularly well suited for use in deposition of sensitive materials, such as organic light-emitting material. Embodiments are also well suited for deposition of other thin- and thick-film layers in packaging applications, integrated-circuit processing applications, and the like.

An illustrative embodiment of the present invention is a direct-patterning deposition system in which a material is vaporized at a source such that it deposits on a surface of a substrate after passing through an aperture pattern of a shadow mask. Prior to their arrival at the shadow mask, the vaporized atoms pass through a collimator that blocks all vaporized atoms except those having propagation angles close to the direction normal to the substrate surface. As a result, the lateral deviation between the apertures and their respective regions of deposited material is reduced as compared to the prior art.

The collimator includes a plurality of channels having a high height-to-width aspect ratio, where the longitudinal axis of the channels is substantially aligned with the normal direction. As a result, those vaporized atoms travelling along directions other than close to normal are blocked by the inside walls of the channels.

In some embodiments, the source is dimensioned and arranged to provide a conically shaped vapor plume of vaporized atoms such that the entire substrate surface receives vaporized material at the same time. In some of these embodiments, the source is moved along a path such that the uniformity of the thickness of deposited material is improved over the two-dimensional area of the substrate surface.

In some embodiments, the source is a linear source that emits a fan-shaped vapor plume, where the linear source is moved along a direction that is unaligned with its longitudinal axis. In some of these embodiments, the source is moved along a direction that is substantially orthogonal to both the longitudinal axis of the source and the normal direction. In some of these embodiments, the source is moved along a non-linear path.

In some embodiments, the source includes a plurality of individual nozzles, each of which emits a conically shaped vapor plume such that the nozzles collectively provide a flow of vaporized atoms that is substantially uniform over the area of the substrate surface.

In some embodiments, the source is a two-dimensional planar source that is arranged parallel to and facing the substrate such that, when heated, organic material vaporizes uniformly across the planar surface of the source. In some embodiments, relative motion between the source and shadow mask is provided to improve the thickness uniformity of the deposited material over the two-dimensional area of the substrate surface.

An embodiment of the present invention is a system for depositing a first material on a plurality of deposition sites in a deposition region of a substrate, the plurality of deposition sites being arranged in a first arrangement, wherein the system comprises: a source for providing a first plurality of vaporized atoms of the first material, each vaporized atom of the first plurality thereof propagating along a propagation direction that is characterized by a propagation angle relative to a first direction that is normal to a first plane defined by the substrate, wherein the range of propagation angles of the first plurality of vaporized atoms spans a first angular range; a shadow mask comprising a plurality of apertures arranged in the first arrangement; and a collimator comprising a plurality of channels, the collimator being between the source and the shadow mask, wherein each channel of the plurality thereof is dimensioned and arranged to pass only vaporized atoms having a propagation angle within a second angular range that is smaller than the first angular range.

Another embodiment of the present invention is a system for depositing a first material on a plurality of deposition sites in a deposition region of a substrate, the plurality of deposition sites being arranged in a first arrangement, wherein the system comprises: a source that is operative for providing a plurality of vaporized atoms, each vaporized atom of the plurality thereof traveling along a propagation direction that defines a propagation angle, wherein the plurality of propagation angles span a first angular range; a shadow mask comprising a plurality of apertures arranged in the first arrangement, wherein the shadow mask and the plurality of deposition sites collectively define an acceptable angular range that is less than the first angular range; and a collimator that is located between the source and the shadow mask, the collimator comprising a plurality of channels, each channel of the plurality thereof having a height-to-width aspect ratio that defines a filtered angular range that is less than or equal to the acceptable angular range.

Yet another embodiment of the present invention is a method for depositing a first material on a plurality of deposition sites arranged in a first arrangement on a substrate, wherein the method comprises: receiving a first plurality of vaporized atoms at a collimator that is located between a source and a shadow mask having a plurality of apertures arranged in the first arrangement, wherein the first plurality of vaporized atoms is characterized by a first range of propagation angles; selectively passing a second plurality of vaporized atoms through the collimator to the shadow mask, wherein the second plurality of vaporized atoms is characterized by a second range of propagation angles that is narrower than the first range of propagation angles; and enabling at least some of the second plurality of vaporized atoms to pass through the plurality of apertures to deposit on the substrate.

BRIEF DESCRIPTION OF THE DRAWINGS

FIG. 5A depicts a schematic drawing of a cross-sectional view of a collimator in accordance with the illustrative embodiment.

FIGS. 5B-C depict schematic drawings of top and sectional views, respectively, of a region of collimator 208.

DETAILED DESCRIPTION

Figure 1:
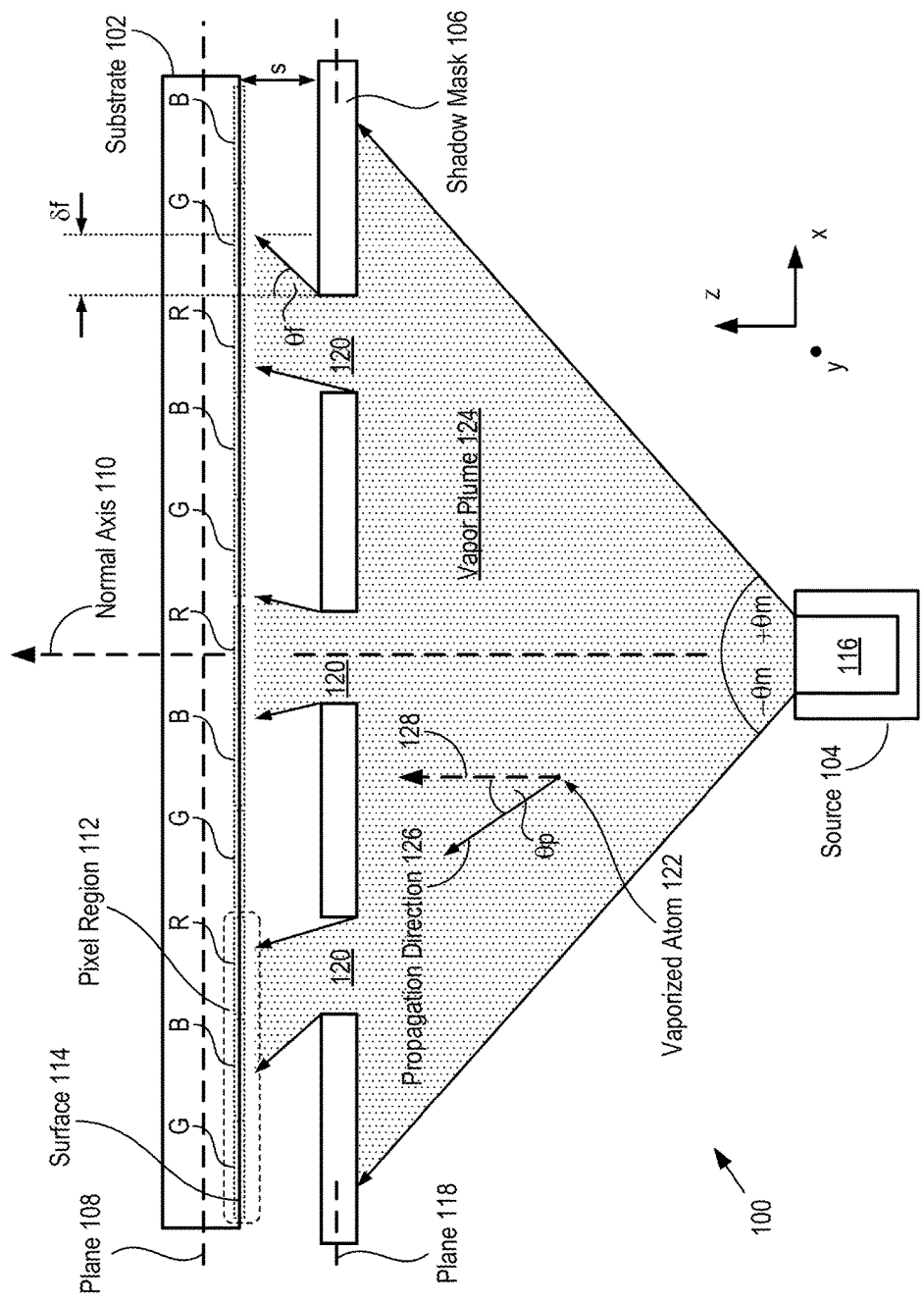
FIG. 1 depicts a schematic drawing of a cross-section of the salient features of a direct-patterning deposition system in accordance with the prior art.

FIG. 1 depicts a schematic drawing of a cross-section of the salient features of a direct-patterning deposition system in accordance with the prior art. System 100 is a conventional evaporation system that deposits a desired pattern of material on a substrate by evaporating the material through a shadow mask positioned in front of the substrate. System 100 includes source 104 and shadow mask 106, which are arranged within a low-pressure vacuum chamber (not shown).

Substrate 102 is a glass substrate suitable for the formation of active-matrix organic-light-emitting-diode (AMO-LED) displays. Substrate 102 includes surface 114, which defines plane 108 and normal axis 110. Normal axis 110 is orthogonal to plane 108. Surface 114 includes a plurality of deposition sites, G, for receiving material that emits green light, a plurality of deposition sites, B, for receiving material that emits blue light, and a plurality of deposition sites, R, for receiving material that emits red light. The deposition sites are arranged in a plurality of pixel regions 112 such that each pixel region includes one deposition site for the light-emitting material of each color.

Source 104 is a crucible for vaporizing material 116, which is centered with respect to substrate 102 and material 116 is an organic light-emitting material that emits red light. When material 116 melts or sublimes within the low-pressure atmosphere of the vacuum chamber, source 104 ejects vaporized atoms 122 that propagate outward from the source in substantially ballistic fashion toward substrate 102. The vaporized atoms ejected by source 104 collectively define vapor plume 124.

Shadow mask 106 is a plate of structural material that includes apertures 120. Shadow mask is substantially flat and defines plane 118. The shadow mask is located between source 104 and substrate 102 such that it blocks the passage of all of the vaporized atoms except those that pass through its apertures. The shadow mask and substrate are separated by separation, s, (typically a few tens or hundreds of microns), planes 108 and 118 are substantially parallel, and apertures 120 are aligned with deposition sites R.

Ideally, when depositing red-emitting material 116, vaporized atoms are incident only on deposition sites R. Unfortunately, vapor plume 124 includes vaporized atoms that travel along many different propagation directions 126, many of which are not aligned with the direction of normal axis 110. As a result, a large fraction of the vaporized atoms that pass through apertures 120 are travelling along propagation directions that have a significant lateral component. The point at which each vaporized atom is incident on surface 114 is geometrically determined by its propagation angle and the spatial relationship between the substrate and shadow mask—specifically, spacing s and the alignment of apertures 120 with deposition sites R. For the purposes of this Specification, including the appended claims, the term "propagation angle" is defined as the angle formed by the propagation direction of a vaporized atom with respect to the direction normal to plane 108 of substrate 102 (i.e., normal direction 128, which is aligned with normal axis 110). For example, vaporized atom 122 travels along a propagation direction 126, which forms propagation angle, $\theta p$, with respect to normal direction 128.

The propagation angles of the vaporized atoms of vapor plume 124 span a relatively large angular range of $-\theta m$ to $+\theta m$, which gives rise to significant disadvantages for prior-art direct-deposition systems. In particular, it results in the deposition of material 118 on surface 114 outside the perimeter of apertures 120, which is typically referred to as "feathering." Furthermore, the amount of feathering at an aperture increases with the distance of that aperture from the center of substrate 102.

For apertures located near the center of vapor plume 124, vaporized atoms 122 arriving at shadow mask 106 have propagation angles that are within a relatively small angular range. In other words, they are travelling along directions that are only slightly misaligned with normal axis 110. As a result, vaporized atoms that pass through these apertures exhibit only minimal lateral drift (i.e., feathering) after passing through the shadow mask. In this region, therefore, the lateral extent of the deposited material 116 is typically nearly aligned with the edges of apertures 120 (i.e., it deposits primarily on the targeted deposition sites R).

For apertures further away from the center of vapor plume 124, however, vaporized atoms arriving at shadow mask 106 span a relatively larger angular range and include propagation angles closer to $|\theta m|$. As a result, in these regions, the lateral distance traveled by vaporized atoms after passing through the shadow mask is greater, leading to deposited material feathering out well beyond the lateral extent of the aperture. This results in a lateral offset, $\delta f$, between the edges of the aperture openings and the perimeters of the areas in which material 116 deposits. The deposited material, therefore, extends beyond the area of the targeted deposition sites. In some cases, such feathering can lead to deposition of material on adjacent deposition sites that are intended for different light-emitting material (i.e., deposition sites, B and/or G), thereby leading to color mixing.

It should be noted that feathering is exacerbated by any additional misalignments between the shadow mask and substrate, such as deviations from the parallelism of planes 108 and 118 (i.e., relative pitch and/or yaw between the mask and substrate), non-flatness of the shadow mask and/or substrate, and translational and/or rotational misalignment between the shadow mask and substrate. Still further, in many prior-art deposition systems (e.g., systems for depositing more than one material, etc.), source 102 is located off-center from the substrate, which leads to even greater feathering problems.

It is an aspect of the present invention, however, that blocking vaporized atoms with propagation angles larger than desirable from reaching shadow mask 106 can significantly reduce feathering, thereby enabling patterns of deposited material having higher resolution and fidelity to the aperture pattern of the shadow mask.

Figure 2:
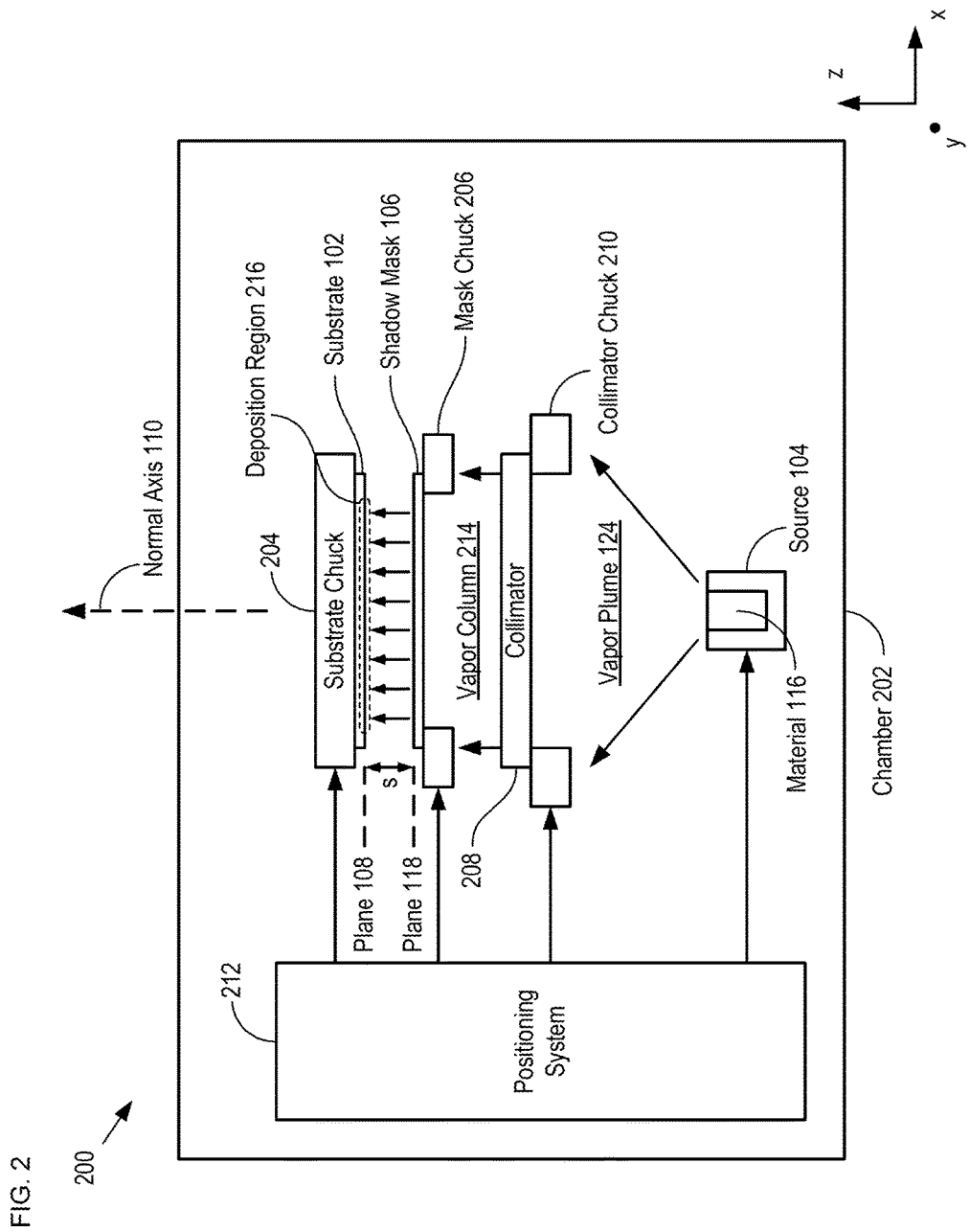
FIG. 2 depicts a schematic drawing of a cross-section of the salient features of a high-precision, direct-patterning deposition system in accordance with an illustrative embodiment of the present invention.

FIG. 2 depicts a schematic drawing of a cross-section of the salient features of a high-precision, direct-patterning deposition system in accordance with an illustrative embodiment of the present invention. System 200 includes vacuum chamber 202, substrate chuck 204, source 104, shadow mask 106, mask chuck 206, collimator 208, and positioning system 210. System 200 is operative for evaporating a desired pattern of material onto a substrate surface without the need for subsequent subtractive patterning operations, such as photolithography and etching.

System 200 is described herein with respect to the deposition of a pattern of light-emitting material on a glass substrate as part of the fabrication of an AMOLED display. However, it will be clear to one skilled in the art, after reading this Specification, that the present invention can be directed toward the formation of directly patterned layers of virtually any thin- and thick-film material (organic or inorganic) on any of a wide range of substrates, such as semiconductor substrates (e.g., silicon, silicon carbide, germanium, etc.), ceramic substrates, metal substrates, plastic substrates, and the like. Further, although the illustrative embodiment is a thermal evaporation system, one skilled in the art will recognize, after reading this Specification, that the present invention can be directed toward virtually any material-deposition process, such as e-beam evaporation, sputtering, and the like. Still further, although the depicted example is a deposition system suitable for use in single-substrate planar processing, the present invention is also suitable for use in other fabrication approaches, such as cluster-tool processing, track processing, roll-to-roll processing, reel-to-reel processing, etc. As a result, the present invention is suitable for use in myriad applications including, without limitation, packaging applications, IC fabrication, MEMS fabrication, nanotechnology device fabrication, ball-grid array (BGA) fabrication, and the like.

Vacuum chamber 202 is a conventional pressure vessel operative for providing a low-pressure atmosphere that supports evaporation of material 116. It should be noted that vacuum chamber 202 can be a standalone unit, part of a cluster deposition system, or part of a track-deposition system where multiple evaporation chambers are arranged in linear chain. In some embodiments, vacuum chamber 202 includes several evaporation sources/shadow mask combinations that enable formation of different patterns of different materials, such as, for example, multiple light-emitting subpixels that emit light at different colors (e.g., red, green, and blue).

Figure 3:
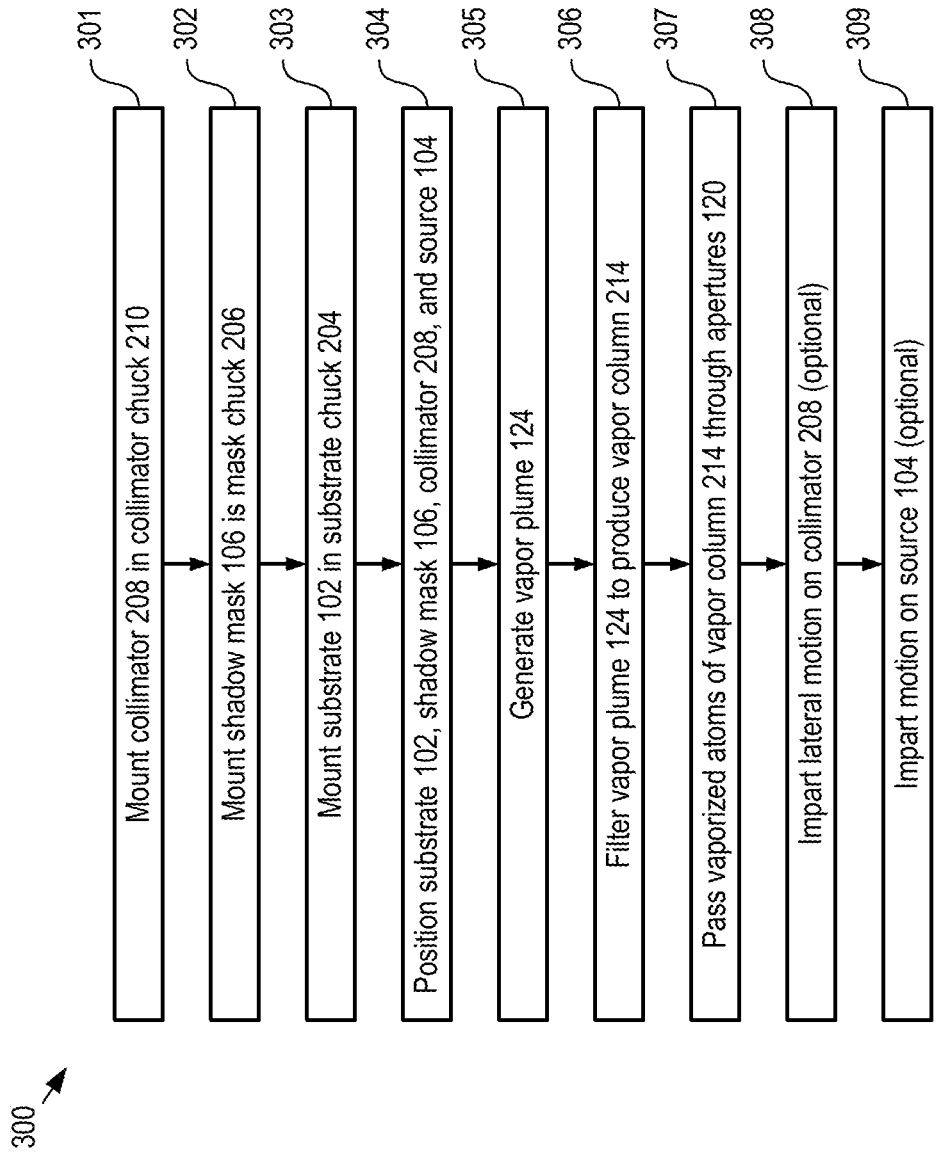
FIG. 3 depicts operations of a method for depositing a directly patterned layer of material on a substrate in accordance with the illustrative embodiment.

FIG. 3 depicts operations of a method for depositing a directly patterned layer of material on a substrate in accordance with the illustrative embodiment. Method 300 is described herein with continuing reference to FIG. 2, as well as reference to FIGS. 4 and 5A-C. Method 300 begins with operation 301, wherein collimator 208 is mounted in collimator chuck 210.

Collimator 208 is a mechanically robust plate comprising a plurality of channels that are separated by thin walls, as described in more detail below and with respect to FIGS. 5A-C. Collimator 208 is dimensioned and arranged to function as a spatial filter that selectively passes vaporized atoms propagating along directions that are nearly normal to plane 108 (i.e., that have very small propagation angles). Collimator 202, therefore, mitigates feathering across the entirety of substrate 102.

Collimator chuck 210 is an annular clamping mechanism for holding and locating the collimator relative to shadow mask 106.

At operation 302, shadow mask 106 is mounted in mask chuck 206.

Mask chuck 206 is a mechanical clamp that locates shadow mask 106 between source 106 and substrate 116. In some embodiments, mask chuck 206 is an electrostatic chuck that analogous to substrate chuck 204. Typically, shadow mask 106 is supported only around its perimeter. As a result, shadow masks in the prior art tend to sag under gravitational forces. Such sag locally increases the gap between mask and substrate in the center and, therefore, exacerbates feathering in this region. In some embodiments, mask chuck 206 includes a slight curvature (e.g., an upward slope) that biases the shadow mask upward to counteract shadow-mask sag due to gravity. In some embodiments, a fine support structure may extend across the opening in mask chuck 206 to support the mask and reduce the gravitational sag.

At operation 303, substrate 102 is mounted in substrate chuck 204.

Substrate chuck 204 is a platen for securing substrate 102 such that the substrate is very flat. Substrate chuck 204 is dimensioned and arranged to contact substrate 102 only from one side (either the frontside or the backside) to mitigate interference with the deposition of material on the other side of the substrate. In the depicted example, substrate chuck 204 is an electrostatic chuck that applies a voltage across a dielectric to electrostatically "clamp" substrate 102 securely in place. In some embodiments, substrate chuck 204 secures the substrate via a different means, such as vacuum, mechanical clamps, from both sides of the substrate, etc. In some embodiments, substrate chuck 204 includes in-situ gap sensors that operate, with positioning system 212 to control the spacing and degree of parallelism between substrate 102 and shadow mask 106.

At operation 304, the relative positions of substrate 102, shadow mask 106, and collimator 208 are controlled by positioning system 212.

Positioning system 212 is a system for controlling the relative positions of substrate 102, source 104, shadow mask 106, and collimator 208. The positioning system includes three six-axis manipulators and an optical alignment system to control the alignment between substrate 102 and shadow mask 106. Each of the six-axis manipulators is operatively connected with each of substrate chuck 204, mask chuck 206, and collimator chuck 210 to control its position along and rotation about each of the x-, y-, and z-axes. In some embodiments, the position of at least one of mask chuck 206 and collimator chuck 210 is not controlled by a six-axis positioner. In some embodiments, positioning system 212 also includes a rotation stage for controlling the relative rotational alignment of substrate 102 and shadow mask 106.

In operation 304, positioning system 212 locates the substrate and shadow mask such that deposition sites, R, in deposition region 216 are aligned with apertures 120, planes 108 and 118 are parallel and the separation, s, between the substrate and shadow mask is as close to zero (i.e., in contact) as possible—preferably within a few microns (e.g., 1-5 microns). In some embodiments, s is another suitable separation distance.

At operation 305, source 104 generates vapor plume 124. As described above and with respect to FIG. 1, the propagation angles of the vaporized atoms of vapor plume 124 span a relatively large angular range of −θm to +θm.

As discussed above and with respect to FIG. 1, the lateral and rotation alignments between substrate 102 and shadow mask 106, the separation, s, between them, and the range of propagation angles, θp, of the vaporized atoms incident on the shadow mask determines the amount of feathering that occurs at surface 114 of the substrate.

Figure 4:
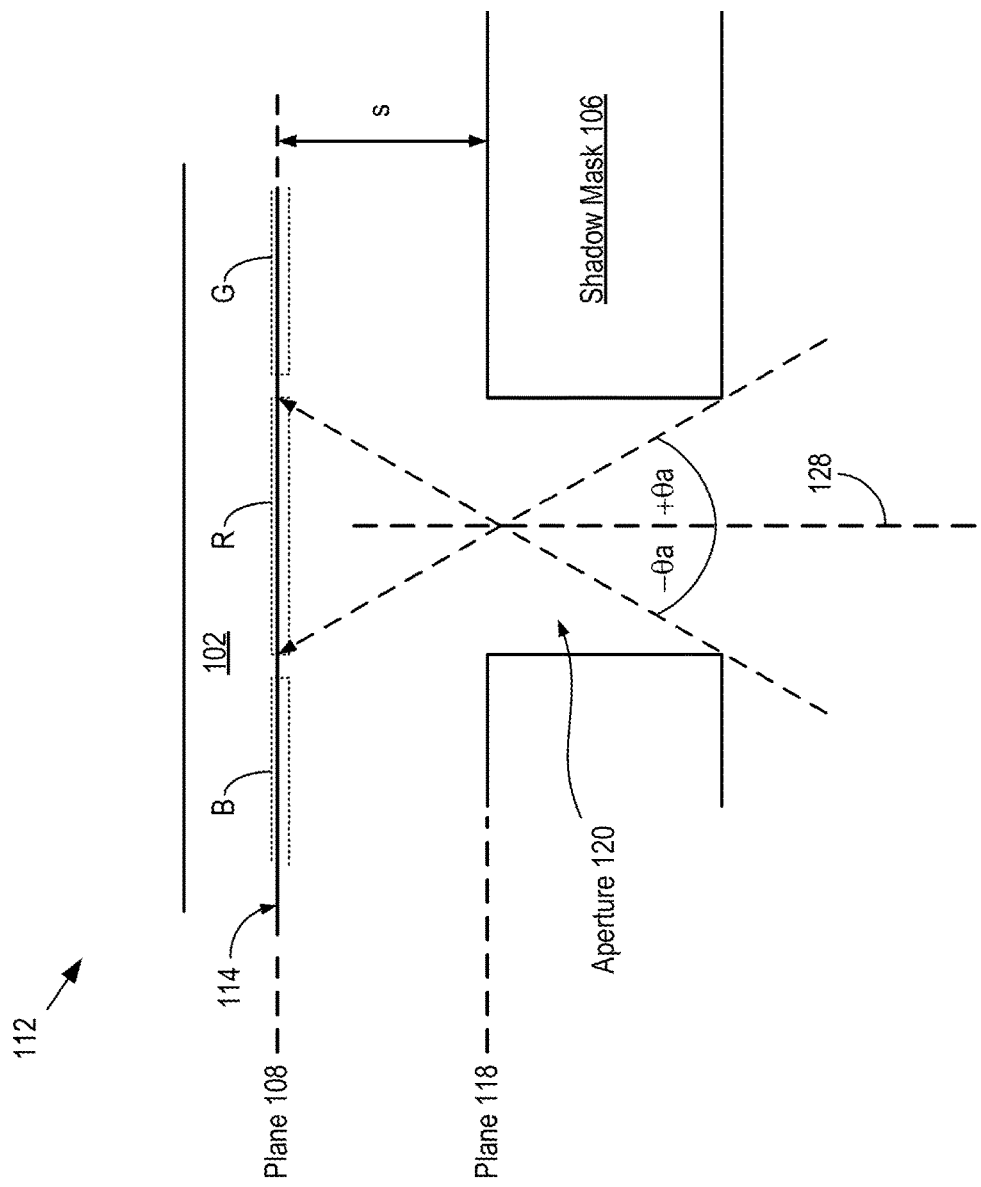
FIG. 4 depicts a schematic drawing of an enlarged view of a pixel region of substrate 102 and its corresponding aperture 120 of shadow mask 106.

FIG. 4 depicts a schematic drawing of an enlarged view of a pixel region of substrate 102 and its corresponding aperture 120 of shadow mask 106. As shown in the figure, for perfect fidelity between aperture 120 and the deposition of material on deposition site, R, the propagation angles of vaporized atoms passed by shadow mask 106 must be within the acceptable range of −θa to +θa. For the purposes of this Specification, including the appended claims, the term "acceptable angular range" is defined as the range of propagation angles that is desired to be passed by the shadow mask, which spans the angular range from −θa to +θa. Typically, the acceptable angular range is that range of angles that enables material 116 to deposit only on deposition sites R after passing through apertures 120. In some embodiments, the acceptable angular range includes a small guard band around the deposition sites to allow for feathering that is less than half the spacing between the closest deposition sites. Any vaporized atom incident on the shadow mask having a propagation angle outside this range would deposit on surface 114 beyond the lateral extent of deposition site R.

At operation 306, vapor plume 124 is filtered by collimator 208 to give rise to vapor column 214.

FIG. 5A depicts a schematic drawing of a cross-sectional view of a collimator in accordance with the illustrative embodiment. Collimator 208 includes body 502, which is patterned to form a plurality of channels 504, each of which extends through the thickness of body 502.

Body 502 is a glass plate suitable for planar processing. In the depicted example, body 502 has a thickness of approximately 25 millimeters (mm); however, any practical thickness can be used without departing from the scope of the present invention. In some embodiments, body 502 comprises a different structurally rigid material that is suitable for withstanding the temperatures associated with thermal and/or e-beam evaporation without significant deformation. Materials suitable for use in body 502 include, without limitation, semiconductors (e.g., silicon, silicon-carbide, etc.), ceramics (e.g., alumina, etc.), composite materials (e.g., carbon fibers, etc.), fiber glass, printed circuit board, metals, polymers (e.g., polyetheretherketone (PEEK), etc.), and the like.

Channels 504 are through-holes formed in body 502 using a conventional processing operation, such as metal forming, drilling, electron-discharge machining, deep reactive-ion etching (DRIE), and the like. In the depicted example, channels 504 have a circular cross-section with a diameter of approximately 3 mm. Channels 504, therefore, have a height-to-width aspect ratio of approximately 8:1. Preferably, the height-to-width aspect ratio is at least equal to 3:1. In addition, for height-to-width aspect ratios that exceed 100:1, the flow of vaporized atoms through the collimator begins to diminish to undesirable levels; however, height-to-width aspect ratios in excess of 100:1 are within the scope of the present invention. In some embodiments, channels 504 have a cross-sectional shape other than circular (e.g., square, rectangular, hexagonal, octagonal, irregular, etc.).

The formation of channels 504 give rise to a plurality of walls 506, which reside between the channels. Preferably, to enable high throughput, walls 506 are as thin as possible without sacrificing the structural integrity of body 502. In the depicted example, walls 506 have an average thickness of approximately 500 microns; however, any practical thickness can be used for walls 506.

FIGS. 5B-C depict schematic drawings of top and sectional views, respectively, of a region of collimator 208. Channels 506 are arranged in a honeycomb arrangement wherein columns are periodic and adjacent columns are offset from their neighbors by a half period. In some embodiments, the channels are arranged in a different arrangement, such as two-dimensional periodic, hexagonally close-packed, random, and the like.

As depicted in FIG. 5C, the aspect ratio of channel 504 defines a filtered angular range. For the purposes of this Specification, including the appended claims, the term "filtered angular range" is defined as the range of propagation angles that will pass through collimator 208, which spans the angular range from $-\theta c$ to $+\theta c$. As a result, a vaporized atom having a propagation angle larger than $|\theta c|$ will be blocked by the collimator.

One skilled in the art will recognize that the dimensions provided above for body 502, channels 504, and walls 506 are merely exemplary and that other dimensions can be used without departing from the scope of the present invention.

At operation 307, apertures 120 pass vaporized atoms of vapor column 214 such that they deposit on deposition sites R in deposition region 216.

At optional operation 308, positioning system 212 imparts motion on collimator 208 to improve the uniformity of vaporized-atom density across the lateral extent of vapor column 214, thereby improving the deposition uniformity across the deposition sites on substrate 102. In some embodiments, positioning system 212 is operative for imparting an oscillating motion to collimator 208.

It should be noted that, in the illustrative embodiment, source 104 is substantially a point source for material 116 because the open area of its crucible is significantly smaller than the area of substrate 102.

At optional operation 309, positioning system 212 moves source 102 in the x-y plane, relative to the substrate, to improve deposition uniformity.

In some embodiments, source 104 is a linear evaporation source that comprises a plurality of nozzles that emits a fan-shaped vapor plume of vaporized atoms. In some embodiments, positioning system 212 moves the linear source along a direction that is unaligned with its longitudinal axis in the x-y plane to improve the uniformity of the deposited material on substrate 102. In some embodiments, this path is a line that is substantially orthogonal to both the linear arrangement of nozzles and normal axis 110. In some of embodiments, the linear source is moved along a non-linear path in the x-y plane.

In some embodiments, source 104 includes a two-dimensional arrangement of nozzles, each of which emits a conically shaped vapor plume such that the plurality of nozzles collectively provides a flow of vaporized atoms that is substantially uniform over the area of the substrate surface. In some embodiments, positioning system 212 moves the two-dimensional arrangement of nozzles to facilitate deposition uniformity. In some embodiments, the two-dimensional arrangement of nozzles is rotated in-plane to facilitate deposition uniformity.

In some embodiments, source 104 is a two-dimensional planar source that includes a layer of material 116 distributed across its top surface. The source is arranged such that this top surface is parallel to and facing substrate 102. When heated, material 116 vaporizes uniformly across the plane. Exemplary planar evaporation sources suitable for use in embodiments of the present invention are disclosed by Tung, et al., in "OLED Fabrication by Using a Novel Planar Evaporation Technique," *Int. J. of Photoenergy*, Vol. 2014 (18), pp. 1-8 (2014), which is incorporated herein by reference.

In some embodiments, to improve the uniformity with which material 116 deposits over the two-dimensional area of surface 114, positioning system 212 imparts a relative motion between source 104 and the combination of substrate 102 and shadow mask 106 by moving at least one of the substrate/mask combination and the source.

It is to be understood that the disclosure teaches just some embodiments in accordance with the present invention and that many variations of the invention can easily be devised by those skilled in the art after reading this disclosure and that the scope of the present invention is to be determined by the following claims.

What is claimed is:

1. A system for depositing a first material on a plurality of deposition sites in a deposition region of a substrate, the plurality of deposition sites being arranged in a first arrangement, wherein the system comprises:
   a source for providing a first plurality of vaporized atoms of the first material, each vaporized atom of the first plurality thereof propagating along a propagation direction that is characterized by a propagation angle relative to a first direction that is normal to a first plane defined by the substrate, wherein the first plurality of vaporized atoms has a first range of propagation angles that spans a first angular range;
   a shadow mask comprising a plurality of apertures arranged in the first arrangement; and
   a collimator comprising a plurality of channels having a height-to-width aspect ratio that is based on an acceptable angular range defined by the substrate and the shadow mask, the collimator being between the source and the shadow mask, wherein the collimator is configured to selectively pass a second plurality of vaporized atoms included in the first plurality of vaporized atoms, wherein the range of propagation angles of the second plurality of vaporized atoms spans a second angular range that is narrower than the first angular range;
   wherein the height-to-width aspect ratio determines the second range of propagation angles; and
   wherein the height-to-width aspect ratio defines a filtered angular range that is less than or equal to the acceptable angular range.

2. The system of claim 1 wherein the height-to-width aspect ratio is equal to or greater than approximately 3:1.

3. The system of claim 1 wherein the height-to-width aspect ratio is equal to or greater than 8:1.

4. The system of claim 1 wherein the source has a single nozzle for emitting the plurality of vaporized atoms, the source being movable relative to the deposition region in two dimensions within a second plane that is substantially parallel with the first plane.

5. The system of claim 1 further comprising a positioning system that is operative for imparting a relative motion between the substrate and the collimator.

6. The system of claim 1 wherein the first material is an organic material.

7. The system of claim 6 wherein the first material is an organic material operative for emitting light.

8. The system of claim 1 wherein the deposition region has a first length along a second direction that is orthogonal to the first direction, and wherein the source includes a plurality of nozzles for emitting the plurality of vaporized atoms, the plurality of nozzles being arranged in a second arrangement having a second length along the second direction, the second length being greater than or equal to the first length.

9. The system of claim 8 wherein the source is movable relative to the deposition region along a third direction, the first direction, second direction, and third direction being mutually orthogonal.

10. The system of claim 8 wherein the second arrangement is a two-dimensional arrangement that has a third length along a third direction, the first direction, second direction, and third direction being mutually orthogonal.

11. The system of claim 1 further comprising a mask chuck for holding the shadow mask around its perimeter, the mask chuck being dimensioned and arranged to mitigate gravity-induced sag of the shadow mask.

12. The system of claim 11 wherein the mask chuck is dimensioned and arranged to induce a mechanical bias in the shadow mask for mitigating the gravity-induced sag.

13. The system of claim 12 wherein the mask chuck is characterized by a slope that gives rise to the mechanical bias when the shadow mask is mounted in the mask chuck.

14. The system of claim 11 further comprising a support structure located in an opening of the mask chuck, wherein the support structure supports the shadow mask when the shadow mask is mounted in the mask chuck.

15. A system for depositing a first material on a plurality of deposition sites in a deposition region of a substrate, the plurality of deposition sites being arranged in a first arrangement, wherein the system comprises:
a source that is operative for providing a plurality of vaporized atoms, each vaporized atom of the plurality thereof traveling along a propagation direction that defines a propagation angle, wherein the plurality of propagation angles span a first angular range;
a shadow mask comprising a plurality of apertures arranged in the first arrangement, wherein the shadow mask and the plurality of deposition sites collectively define an acceptable angular range that is less than the first angular range;
a mask chuck for holding the shadow mask around its perimeter, the mask chuck being configured to mitigate gravity-induced sag of the shadow mask; and
a collimator that is located between the source and the shadow mask, the collimator comprising a plurality of channels, each channel of the plurality thereof having a height-to-width aspect ratio that defines a filtered angular range that is less than or equal to the acceptable angular range.

16. The system of claim 15 wherein the substrate defines a first plane and a first direction that is normal to the first plane, and wherein the source comprises a plurality of nozzles for emitting the plurality of vaporized atoms, the plurality of nozzles being arranged in a second arrangement that has a first length along a second direction in a second plane that is substantially parallel with the first plane, and further wherein the source is movable along a path in the second plane, the path being unaligned with the second direction.

17. The system of claim 15 wherein the deposition region has a first area in a first plane, and wherein the source includes a first nozzle for emitting the plurality of vaporized atoms, and further wherein the source is movable within a second plane that is substantially parallel with the first plane.

18. The system of claim 15 further comprising a positioning system, the positioning system being operative for imparting a relative motion between the collimator and the substrate.

19. The system of claim 15 wherein the height-to-width aspect ratio is at least 3:1.

20. The system of claim 15 wherein the height-to-width aspect ratio is at least 8:1.

21. The system of claim 15 further comprising a support structure located in an opening of the mask chuck, wherein the support structure supports the shadow mask when the shadow mask is mounted in the mask chuck.

22. The system of claim 15 wherein the mask chuck is dimensioned and arranged to induce a mechanical bias in the shadow mask for mitigating the gravity-induced sag.

23. The system of claim 22 wherein the mask chuck is characterized by a slope that gives rise to the mechanical bias when the shadow mask is mounted in the mask chuck.

24. A method for depositing a first material on a plurality of deposition sites arranged in a first arrangement on a substrate, wherein the method comprises:
providing a collimator that includes a plurality of channels, each channel of the plurality thereof having a height-to-width aspect ratio that is based on an acceptable angular range defined by the substrate and the shadow mask, wherein the height-to-width aspect ratio defines a filtered angular range that is less than or equal to the acceptable angular range;
locating the collimator between a source and a shadow mask having a plurality of apertures arranged in the first arrangement;
receiving a first plurality of vaporized atoms at the collimator, wherein the first plurality of vaporized atoms is characterized by a first range of propagation angles;
selectively passing a second plurality of vaporized atoms through the collimator to the shadow mask, wherein the second plurality of vaporized atoms is characterized by a second range of propagation angles that is narrower than the first range of propagation angles, wherein the second range of propagation angles is determined by the height-to-width aspect ratio; and
enabling at least some of the second plurality of vaporized atoms to pass through the plurality of apertures to deposit on the substrate.

25. The method of claim 24 further comprising imparting a relative motion between the collimator and the substrate.

26. The method of claim 24 further comprising:
generating the first plurality of vaporized atoms at a source; and
moving the source relative to the substrate.

27. The method of claim 26 further comprising providing the source as a linear arrangement of nozzles.

28. The method of claim 26 further comprising providing the source as a two-dimensional arrangement of nozzles.

29. The method of claim 24 further comprising mounting the shadow mask in a mask chuck operative for mitigating gravity-induced sag of the shadow mask.

30. The method of claim 29 further comprising providing the mask chuck such that it includes a support structure located in an opening of the mask chuck, wherein the support structure supports the shadow mask when the shadow mask is mounted in the mask chuck.

31. The method of claim 29 further comprising providing the mask chuck such that it induces a mechanical bias in the shadow mask that mitigates the gravity-induced sag.

32. The method of claim 31 wherein the mask chuck is provided such that it is characterized by a slope that gives rise to the mechanical bias when the shadow mask is mounted in the mask chuck.

* * * * *